(12) United States Patent
Deuringer et al.

(10) Patent No.: US 7,302,041 B2
(45) Date of Patent: Nov. 27, 2007

(54) METHOD FOR ESTIMATING THE REMAINING LIFE SPAN OF AN X-RAY RADIATOR

(75) Inventors: Josef Deuringer, Herzogenaurach (DE); Jörg Freudenberger, Eckental (DE); Peter Schardt, Aisch (DE); Markus Schild, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 580 days.

(21) Appl. No.: 10/922,674

(22) Filed: Aug. 20, 2004

(65) Prior Publication Data

US 2007/0189463 A1 Aug. 16, 2007

(30) Foreign Application Priority Data

Aug. 22, 2003 (DE) ............................... 103 38 693

(51) Int. Cl.
*H05G 1/54* (2006.01)
(52) U.S. Cl. .................... 378/118; 378/117; 378/207
(58) Field of Classification Search ............ 378/91, 378/98, 98.5, 101, 117, 118, 207
See application file for complete search history.

(56) References Cited

U.S. PATENT DOCUMENTS

| 5,668,850 A | * | 9/1997 | Abdel-Malek | 378/210 |
|---|---|---|---|---|
| 5,736,930 A | * | 4/1998 | Cappels | 340/642 |
| 6,212,256 B1 | | 4/2001 | Miesbauer et al. | 378/118 |
| 6,325,540 B1 | | 12/2001 | Lounsberry et al. | 378/207 |
| 6,351,517 B1 | * | 2/2002 | Guru et al. | 378/91 |
| 6,426,997 B1 | | 7/2002 | Fuchs et al. | 378/118 |
| 6,453,009 B2 | | 9/2002 | Berezowitz | 378/118 |

* cited by examiner

*Primary Examiner*—Jurie Yun
(74) *Attorney, Agent, or Firm*—Schiff Hardin LLP

(57) ABSTRACT

In a method for estimating the remaining life span of an X-ray radiator that has been installed in an X-ray apparatus and is operational, under specified test conditions and at time intervals, a measurement value that is indicative for the remaining life span of the X-ray radiator is determined and stored in a memory. A forecasted progression of future measurement values is then forecasted from the instantaneous measurement value and previous measurement values that were determined under identical test conditions, which also are stored in the memory. The forecasted remaining life span of the X-ray radiator is then determined based on the forecasted progression and a limit value that is associated with the individual X-ray radiator, which is stored in the memory.

18 Claims, 3 Drawing Sheets

METHOD FOR ESTIMATING THE REMAINING LIFE SPAN OF AN X-RAY RADIATOR

BACKGROUND OF THE INVENTION

1. Field of the Invention

The present invention relates to a method for estimating the remaining life span of an X-ray radiator that has been installed in an X-ray apparatus and is operational.

2. Description of the Prior Art

An X-ray apparatus—in the context of the present invention, any type of X-ray apparatus for producing an X-ray image or an X-ray image dataset or for therapeutic irradiation, but also an X-ray computed tomography system—includes an X-ray radiator. If it fails, the X-ray system can no longer be operated, and the X-ray radiator must be replaced. This can lead to undesirable downtime, particularly in the event of an unexpected failure. It is therefore desirable to detect a potential failure of the X-ray radiator in time to be able to plan the replacement of the X-ray radiator accordingly, particularly in order to be able to schedule the replacement at times during which the X-ray apparatus is not in use. Failure of the X-ray radiator during an examination of a patient with the X-ray apparatus is to be avoided, if only for reasons of radiation safety.

U.S. Pat. Nos. 6,212,256 and 6,453,009 describe methods by means of which a fault in an X-ray tube can be detected early by statistical techniques. Several operating parameters of an operational X-ray tube are monitored, and the monitored operating parameters are compared to prescribed reference values that have been defined based on an analysis of a set of comparable X-ray tubes. If it is determined by the comparison that the X-ray tube is likely to fail in a short time, an alarm signal is generated or an X-ray tube replacement is automatically planned.

U.S. Pat. No. 6,426,997 describes an X-ray tube with a thermal radiator and an alarm device that emits an alarm signal given an imminent failure of the thermal radiator based on at least one parameter of the thermal radiator that is measured and analyzed.

U.S. Pat. No. 6,325,540 describes a method for the remote diagnosis and remote configuration of an active medical device.

It is customary today to replace the X-ray radiator only after it fails. This can lead to unwanted unavailability of the X-ray apparatus. Furthermore, because service calls usually have to be planned, sudden failure of the X-ray radiator leads to relatively long downtimes.

SUMMARY OF THE INVENTION

An object of the invention is to provide a method with which the remaining life span of an operational X-ray radiator can be more accurately predicted.

The object is achieved in accordance with the invention by a method for estimating the remaining life span of an operational X-ray radiator that has been installed in an X-ray apparatus, including the steps of determining a suitable measurement value for the remaining life span of the operational X-ray radiator under given test conditions and at time intervals, storing the determined measurement value in a memory, determining a forecasted progression of future measurement values from the instantaneous measurement value and the previous measurement values that are stored in the memory, which were determined under the same test conditions, and determining a forecasted remaining life span of the X-ray radiator based on the forecasted progression and a limit value that is allocated to the individual X-ray radiator, which is stored in the memory.

The above object also is achieved in accordance with the invention by a method for estimating the remaining life span of an operational X-ray radiator that has been installed in an X-ray apparatus, including the steps of determining of a suitable measurement value for the remaining life span of the operational X-ray radiator under defined test conditions and at time intervals, and determining a forecasted remaining life span of the X-ray radiator from the measurement value based on a characteristic curve that is allocated to the measurement value and the individual X-ray radiator, which is stored in a memory, and based on a limit value that is allocated to the individual X-ray radiator, which is also stored in the memory.

According to the inventive method, the X-ray radiator is operational, i.e. installed in the X-ray apparatus, even during the measuring. In a preferred embodiment of the invention, in order to increase the accuracy of the predicted remaining life span of the X-ray radiator, forecasted remaining life spans are determined for various measurement values, each of which is associated with one of the individual measurement values. The forecasted remaining life span of the X-ray radiator is then the shortest of the forecasted remaining life spans associated with the individual measurement values. The prediction of the failure of the X-ray radiator accordingly can be performed for various measurement parameters, ie. effects, according to algorithms that are adapted (matched) to the corresponding measurement parameters.

The remaining life span is predicted using known physical relations. Measurement values that have been registered under given test conditions, i.e. selected operating conditions, constitute the database. Preferably, a statistically sufficient dataset of an operating period with non-variable usage behavior is utilized for forecasting. In the event that a malfunction leads to continuous degradation, the data can be evaluated from that moment.

The basic progression of the change of behavior of the X-ray radiator is known from theoretical or experimentally determined knowledge. For instance, amplitudes, spectra, or frequencies of individual measurement values can change. The radiator-specific measurement values can be approximated by essentially known curve progressions. The limit value for each effect also can be theoretically calculated or experimentally determined or is defined by legal safety margin conditions. Thus, for observed effects, a probable life span progression can be established that is associated with the individual X-ray radiator, and based on the determined measurement values, the forecasted remaining life span can be determined. The forecasted progression of future measurement values also can be determined by extrapolating the history of measured measurement values. The forecasted remaining life span of the X-ray radiator is then the shortest of the forecasted remaining life spans associated with the individual measurement values.

In order to verify the results of the forecasting, information about the operating time, scan time or integrated scan energy, among other things, is utilized. Additional quality criteria or factors influencing the remaining life span can be detected by suitable measuring systems and factored into the forecasting.

According to the inventive method the limit value is individually allocated to the X-ray radiator. Unavoidable variances in the manufacturing of X-ray radiators thus are taken into account in the determination of the forecasted remaining life span, which increases the accuracy of the forecasted remaining life span. In particular, the forecasted remaining lifetime can be calculated more precisely than if a limit value were the same for all X-ray radiators. For instance, the radiator housing of an X-ray radiator usually is filled with oil as a coolant for the X-ray tube that is disposed in the radiator housing, The oil pressure before shipment, however, differs from one X-ray radiator to the next, and therefore, in order to get a good estimate of remaining life span, it is necessary to individually set the limit value for an oil pressure at which the X-ray radiator is likely to fail. The resistance of the electron emitter of the X-ray tube is also subject to production variations, and therefore an individual limit value is needed for the purpose of measuring in order to determine electron emitter wear and tear.

According to a preferred variant of the inventive method, the limit value that is allocated to the individual X-ray radiator is determined by measuring the individual X-ray radiator before it is installed in the X-ray apparatus. This measurement value for the individual X-ray radiator in new condition can be determined at the tube factory, i.e. at the manufacturer, with relatively precise measuring instruments. The X-ray radiator can also be tested with more precise measuring technology at the manufacturer than after installation. The previously determined measurement value is therefore the starting value of the individual curve progression of a particular X-ray radiator parameter. The expected curve progression of the analyzed parameter, i.e. measurement value, can thus be adapted to the individual X-ray radiator being tested, which increases the accuracy of the remaining life span estimate. The measurement values are not determined with the aid of external measuring devices during the operation of the X-ray radiator, but rather by the X-ray apparatus itself. According to another variant of the inventive method, in order to at least partly compensate the measurement tolerances of the X-ray apparatus, the measurement value that was determined prior to the installation of the X-ray radiator is compared with a corresponding measurement that is performed by the X-ray apparatus during the installation of the X-ray radiator into the X-ray apparatus. Differences between the measurement with the X-ray apparatus during installation and the measurement prior to installation thus can be compensated.

The measurement values are determined during the regular operation of the X-ray apparatus by the apparatus itself. The temperature or pressure in the X-ray radiator can be measured with each exposure, and the remaining life span can be determined therefrom. The condition of the cooling system can be determined from the time dependency of the heating and cooling curves, and potential leakages and leakage rates can be derived from the absolute values. A change of voltage stability is detectable by observation of the frequency of flashovers or the transported charge quantity per flashover. Flashovers in the X-ray radiator can be distinguished from tube arcing, which the X-ray radiator exhibits in normal operation, by measuring a pressure wave. Flashovers indicate a relatively short remaining life span. The oil quality can be determined on an ongoing basis using modem oil sensors.

Alternatively, measurement values can be determined with the X-ray tube installed but under defined test conditions for instance in the scope of a quality measurement, rather than during exposure. Particularly when the measurement values are determined in the scope of a quality measurement, not only are the measurement values registered during regular clinical operation, i.e. in the scope of the conventional operation of the X-ray apparatus and the X-ray radiator, but scans are also performed under precisely defined margin conditions. Scans may also be performed by means of a scan filter.

Prescribed test conditions and the appertaining measurement values are, for example:

1. Test Condition: constant dose rate, or constant tube current and constant tube voltage; Measurement Value; dose rate or tube current; Observed Effect: continuous decline in dose rate.

2. Test Condition: constant tube current, or cathode heating current and constant tube voltage; Measurement Value: heating current or tube current; Observed Effect: radiator wear due to vaporization.

3. Test Condition: relatively long charging of the X-ray radiator with a tube current; Measurement Value: determination of time variation of the heating current; Effect: indicates the internal pressure of the X-ray tube.

4. Test Condition: (for an X-ray radiator with a rotary anode tube): defined rate of anode rotation; Measurement Value: detection of a vibration that is generated by the anode, e.g. with the aid of a motion detector, or detection of a sound produced by the anode, for instance with a microphone; Effect: change or defect of the anode bearing.

5. Test Condition: (for an X-ray radiator with a rotary anode tube): defined rate of anode rotation; Measurement Value: determination of the progression of the rate of anode rotation after the drive for the anode is switched off; Effect; change or defect of the anode bearing.

In a preferred embodiment the memory is disposed at the X-ray radiator, so the measurement value that is determined prior to installation can already be stored in the memory when the X-ray radiator is shipped. When the X-ray radiator is replaced, the memory contains the history of the measurement values that have been detected, so that the X-ray radiator can be further analyzed relatively easily if so desired, for instance in the tube factory.

The forecasted remaining life span of the X-ray radiator is determined by a data processor of the X-ray apparatus, for example. If the X-ray apparatus is connectible to an information communication network, as provided in an embodiment of the inventive method, then information about the forecasted remaining life span of the X-ray radiator can be transferred from the data processor to a second data processor that is connected to the communication network. The information about forecasted remaining life span can then be evaluated by the second data processor in order to prepare a necessary replacement of the X-ray radiator.

Alternatively, according to another embodiment of the inventive method, the memory can be allocated to the second data processor, and the measurement value can be transferred to the second data processor over the communications network, in order for the second data processor to determine the forecasted remaining life span of the X-ray radiator, if measurement values of several operational X-ray radiators are transmitted to the second data processor, the manufacturer of the X-ray radiator has a relatively good overview of the potential remaining life spans of the currently operational X-ray radiators ft has sold. This information is useful in supplying X-ray radiators as replacement parts.

According to a preferred embodiment of the inventive method, if an automatic comparison is performed in order to determine whether the remaining life span of the X-ray radiator is less than a defined value, then a replacement of the X-ray radiator can be automatically planned. The defined value takes the form of an operating time, scan seconds, or energy, for example.

DESCRIPTION OF THE PREFERRED EMBODIMENTS

Figure 1:
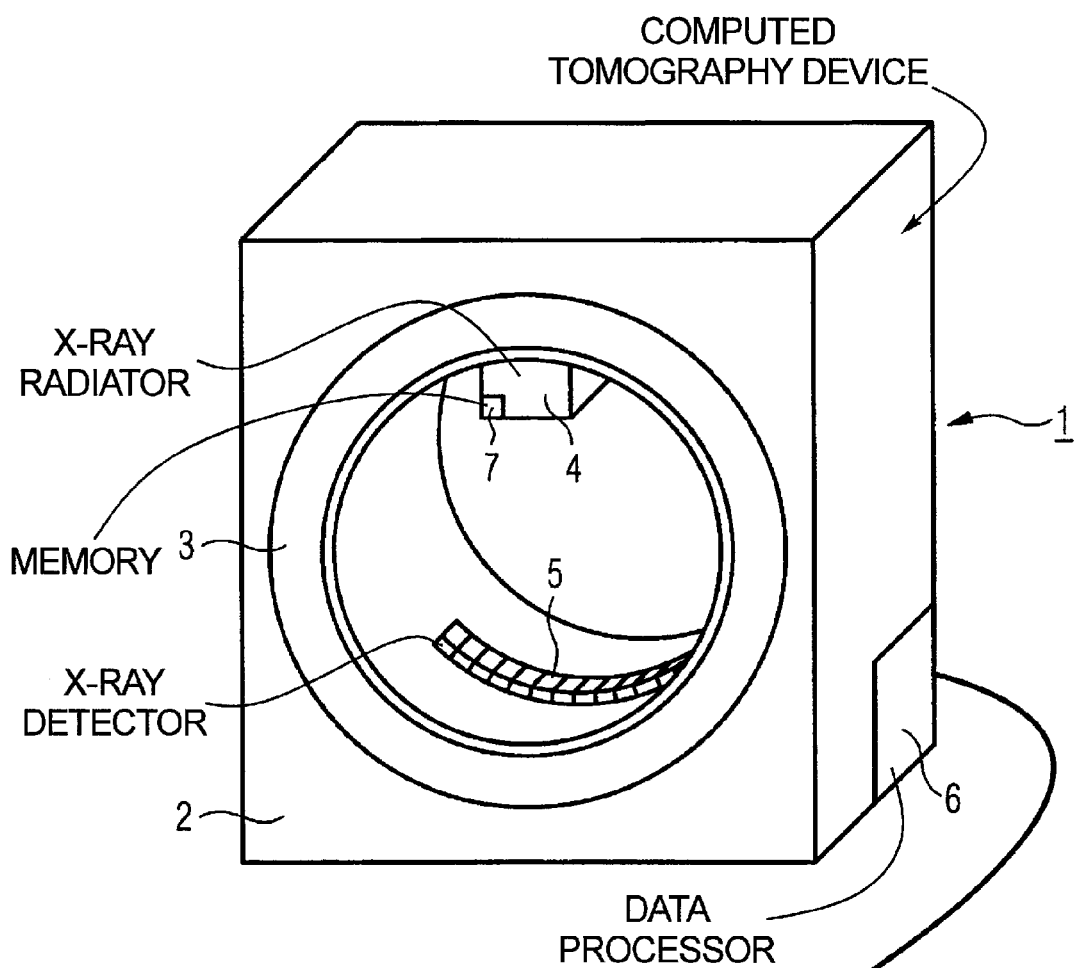
FIG. 1 schematically illustrates an operational X-ray apparatus, the life span of which is forecastable with the inventive method.

FIG. 1 shows an X-ray apparatus, in this case a computed tomography device 1 with a stationary part 2 and a gantry 3 that rotates relative to the stationary part 2. An X-ray radiator 4 with a rotary anode tube (not shown) is arranged at the gantry 3. Arranged at the gantry across from the X-ray radiator 4 is an X-ray detector 5, which receives the X-ray radiation that is emitted by the operational X-ray radiator 4 and attenuated during its passage through an examination subject (neither the X-ray radiation nor the examination subject are represented in FIG. 1). The gantry 3 rotates relative to the stationary part 2 around the examination subject 1 during the operation of the computer tomography device 1, whereby a computer 6 of the computer tomography system 1 creates CT images of relevant volume of the examination subject by known means from the electrical signals that are generated by the X-ray detector 5.

Figure 2:
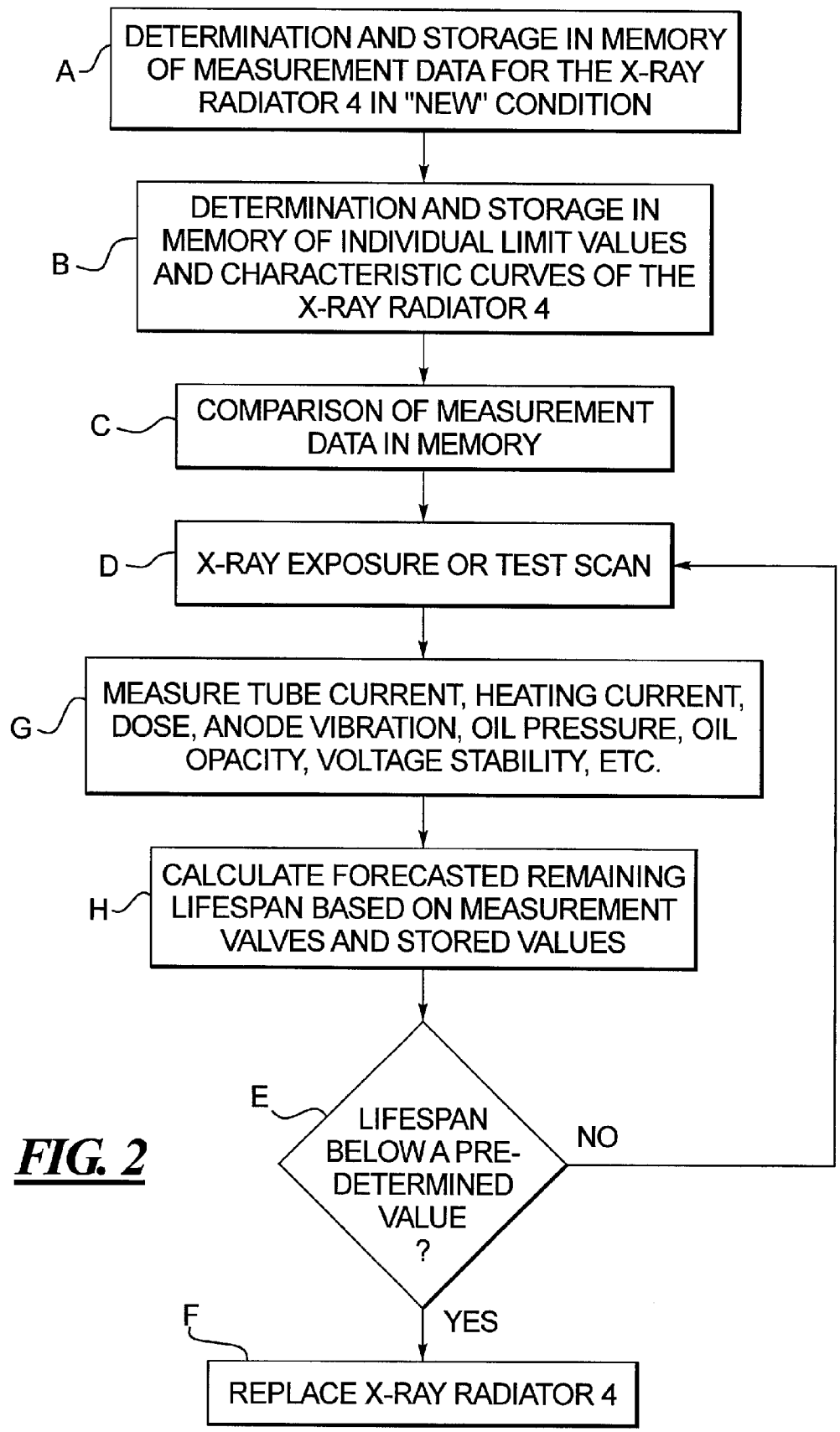
FIG. 2 is a flowchart for an embodiment the inventive method.

In the exemplary embodiment, the X-ray radiator 4 additionally has a memory 7 like the memory described in U.S. Pat. No. 6,325,640. According to the exemplary embodiment, the following measurement values are stored in the memory 7, which were recorded under defined test conditions at the manufacturer of the X-ray radiator 4 before the X-ray radiator 4 was shipped; i.e., the memory 7 contains measurement values that are individually allocated to the X-ray radiator 4, which the X-ray radiator 4 exhibits in its new (shipped) condition (Step A of the flowchart represented in FIG. 2):

measured tube current given a constant defined dose rate;

measured heating current given a constant tube current and tube voltage;

measured vibration and loudness of the anode of the rotary anode tube given a constant rate of anode rotation;

time progression of the rate of anode rotation given the abrupt deactivation of the anode drive, assuming a fixed constant rate of anode rotation;

measured time variation of the tube heating current given a charging of the X-ray radiator 4 for a predetermined relatively long time with a predetermined relatively high tube current, oil pressure of the oil with which the unrepresented housing of the X-ray radiator 4 is filled as a means of cooling the rotary anode tube of the X-ray radiator 4;

the opacity of the oil; and voltage stability of the X-ray tube.

Limit values that are allocated to the X-ray radiator 4 for each of the measured measurement values are also stored in the memory 7 of the radiator 4. When the X-ray radiator 4 reaches one of the limit values, the X-ray radiator 4 has attained its life span. In the case of the present exemplifying embodiment, these limit values have been determined on the basis of theoretical calculations and experimental tests and individually adapted to the X-ray radiator 4 based on the measurement values of the X-ray radiator 4. The memory 7 also contains expected progressions (characteristic curves) of the individual measurement values, i.e. X-ray radiator parameters, as a function of the number of examinations performed, the time, or the emitted X-ray dose rate. The basic curves have been determined theoretically or experimentally and individually adapted to the X-ray radiator 4 based on the previously measured measurement values (Step B of the flowchart in FIG. 2). The probable curves (characteristic curves) that are stored according to the present exemplifying embodiment include, among others, the probable curve of the measured tube current given a defined constant dose rate as a function of the cumulative dose rate emitted by the X-ray radiator 4, the probable curve of the measured vibration and loudness of the anode of the rotary anode tube given a predetermined constant rate of anode rotation as a function of the operating time, the probable variation of the time progression of the anode rotation rate given an abrupt deactivating of the anode drive and given a defined constant rate of anode rotation as a function of the operating time, and the probable variation of the time variation of the tube heating current given charging of the X-ray radiator 4 for a predetermined relatively long time with a predetermined relatively high tube current as a function of the operating time. The probable curves of the operating parameters are individually adapted to the X-ray radiator 4 as explained above.

In operation, measurement values that correspond to the previously determined measurement values which are stored in the memory 7 are measured by the computed tomography device 1 under defined test conditions that are at least comparable to the test conditions under which the previously detected stored measurement values were registered. In the exemplary embodiment, upon installation of the X-ray radiator 4 in the computed tomography device 1, the previously registered measurement parameters are again registered by the computer tomography device 1 and compared with the previous measurement values already filed in the memory 7 (Step C of the flowchart in FIG. 2).

In order to estimate the remaining life span of the X-ray radiator 4 in the installed condition from measurements that are taken in the installed condition, according to the: present exemplifying embodiment, with each CT exposure performed by the computed tomography device 1, the oil pressure of the oil with which the radiator housing is filled, the opacity of the oil, and the voltage stability of the X-ray tube are measured and stored in memory 7. In the case of the present exemplifying embodiment, additional test scans are performed in the scope of quality measurements in order to measure the tube current given a constant defined dose rate, the heating current given a constant tube current and constant tube voltage, the vibration and loudness of the anode given a constant anode rotation rate, the time curve of the anode rotation rate given an abrupt deactivating of the anode drive based on a defined constant anode rotation rate, and the time variation of the tube heating current given charging of the X-ray radiator 4 for a predetermined relatively long time with a predetermined relatively high tube current (steps D and G of the flowchart represented in FIG. 2). The determined measurement values are likewise stored in the memory 7.

The computer 6 of the computer tomography device 1 calculates the forecasted remaining life spans of the X-ray radiator 4 that are associated with the individual measurement parameters by means of a computer program from the previously determined measurement values, the presently determined measurement values, and the expected measurement values, which are stored in the memory 7, as well as the individual limit values and expected progressions which were filed in memory 7 (step H). The shortest of these remaining life spans is then the forecasted life span of the X-ray radiator 4. In the exemplary embodiment, if the forecasted remaining life span of the X-ray radiator 4 is less than a specified value that is stored in the memory 7, then the computer 6 of the computed tomography device 1 generates a message about an expected failure of the X-ray radiator 4 and transfers the message over an information communications network 8 to a central computer 9, whereby the computer 6 of the computed tomography device 1 and the central computer 9 are connected to the communications network 8. In the exemplary embodiment, the central computer 9 is operated by the manufacturer of the X-ray radiator 4, so that based on the received message, it can prepare a necessary radiator replacement before the X-ray radiator 4 fails (steps E and F of the flowchart in FIG. 2).

Figure 3:
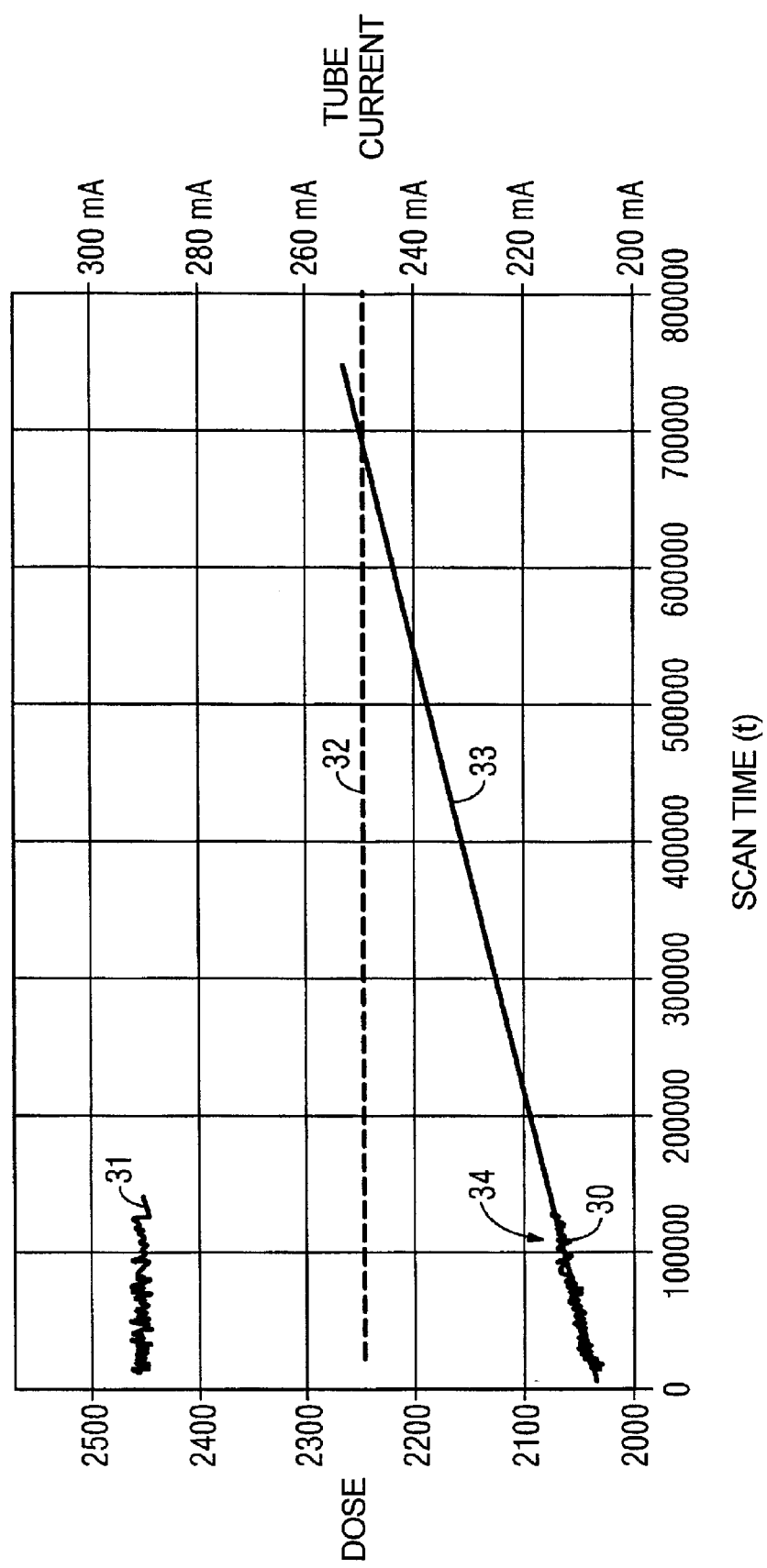
FIG. 3 is a measurement diagram for use in the inventive method.

As an example of the calculation of a remaining life span that is associated with an individual measurement value, FIG. 3 represents varying measured tube currents 30 given a constant measured dose rate 31 as a function of the cumulative operating time t, As can be seen from FIG. 3, the required tube current 30 increases with cumulative operating time t so that a constant dose rate 31 is achieved. In the case of the present exemplifying embodiment, it was determined prior to the installation of the X-ray radiator 4 that its life span would be over when the individual X-ray radiator 4 required a tube current of 250 mA in order to generate the specified constant dose rate 31. This is the limit value 32 that is assigned to the measurement value "tube current 30 given constant dose rate 31."

Furthermore, it is known from theoretical determinations and from experience that the required tube current 30 varies approximately linearly with the cumulative operating time t (in seconds in FIG. 3), as emerges from the characteristic curve 33 in FIG. 3. The characteristic curve 33 is filed in the memory 7 and adapted to the individual X-ray radiator 4.

It is therefore possible to estimate the operating time at which the X-ray radiator 4 will fail based on the measurement parameter "tube current given constant dose rate," i.e., to calculate the forecasted remaining life span that is allocated to the measurement parameter "tube current given constant dose rate," based on the instantaneous measuring of the tube current 30 (whereby the instantaneous measurement value is referenced 34), the characteristic curve 33, and the predetermined limit value 32. In the exemplary embodiment, the X-ray radiator 4 presently requires a tube current 30 of approximately 215 mA in order to emit the constant dose rate 32. Thus, a forecasted remaining life span of approximately 550,000 seconds of operating time emerges from the characteristic curve 33. Based on the average daily operating time of the computer tomography device 1, which can be documented by the computer 6, the time at which the X-ray radiator 4 has to be replaced can also be forecasted.

Alternatively the forecasted remaining life span can also be estimated by the extrapolation of the progression of the tube current 30 given constant dose rate 31 based on the previously registered measurement values for the tube current 30 that are stored in the memory 7 and the instantaneously measured value 34. Based on the extrapolation and the limit value 32, the forecasted remaining life span associated with the measurement parameter "tube current given constant dose rate" can be calculated in turn.

In the above described embodiment, the measurement values, the individual limit values, and the expected progressions are stored in the memory 7 of the X-ray radiator 4. Another possibility is that these values are filed in a database 10 that is allocated to the central computer 9, and the computer 6 of the computer tomography device 1 transfers the measurement values that are determined by the computer tomography device 1 to the central computer 9 over the information communications network 8, so that the forecasted remaining lifetime is determined by means of a program running on the central computer 9.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for estimating a remaining life span of an X-ray radiator, comprising the steps of:
    determining, under defined test conditions and at respective time intervals, a measurement value from an X-ray radiator, operationally installed in an X-ray apparatus, indicative of a remaining life span of said X-ray radiator;
    storing said measurement value in a memory;
    determining a forecasted progression of future measurement values for said X-ray radiator based on said measurement value and based on previous measurement values, determined under said test conditions at earlier times and stored in said memory; and
    determining a forecasted remaining life span of said X-ray radiator based on said forecasted progression and a limit value, stored in said memory, associated with said X-ray radiator.

2. A method as claimed in claim 1 comprising:
    determining a plurality of different measurement values under said defined test conditions and respective time intervals, for said X-ray radiator;
    for each of said measurement values determining a forecasted progression of future measurement values based on the respective measurement value and previous respective measurement values determined at earlier times under said test conditions and stored in said memory, thereby providing a plurality of forecasted progressions; and
    determining said forecasted remaining life span based on said plurality of forecasted progressions and a limit value, stored in said memory, for each of said forecasted progressions for said X-ray radiator.

3. A method as claimed in claim 1 comprising determining said limit value for said X-ray radiator prior to installation of said X-ray radiator in said X-ray apparatus.

4. A method as claimed in claim 3 wherein said previous measurement values include a measurement value obtained prior to installation of said X-ray radiator in said X-ray apparatus, and determining said forecasted progression by comparing said measurement value determined under said test conditions and at said respective time intervals with said measurement value obtained prior to installation.

5. A method as claimed in claim 1 comprising locating said memory at said X-ray radiator.

6. A method as claimed in claim 5 wherein said X-ray apparatus includes a data processor disposed at said X-ray apparatus, and comprising accessing said memory at said X-ray radiator by said data processor, and determining the forecasted remaining life span of the X-ray radiator in said data processor.

7. A method as claimed in claim 6 wherein said data processor is a first processor, and comprising establishing a communication link between said first data processor and a second data processor, located remote from said X-ray apparatus, via a communication network.

8. A method as claimed in claim 1 wherein said X-ray apparatus includes a first data processor, and comprising establishing a communication link between said first data processor and a second data processor, located remote from said X-ray apparatus, via a communications network, disposing said memory at said second data processor, transferring said measurement values from said first data processor to said memory via said communication network, and determining said forecasted remaining life span of said X-ray radiator in said second data processor.

9. A method as claimed in claim 1 comprising automatically planning a replacement of said X-ray radiator when said forecasted remaining life span of said X-ray radiator falls below a predetermined value.

10. A method for estimating a remaining life span of an X-ray radiator, comprising the steps of:
  determining, under defined test conditions and at respective time intervals, a measurement value from an X-ray radiator, operationally installed in an X-ray apparatus, indicative of a remaining life span of said X-ray radiator; and
  determining a forecasted remaining life span of said X-ray radiator from said measurement value based on a characteristic curve for said X-ray radiator stored in a memory, and based on a limit value associated with said X-ray radiator stared in said memory.

11. A method as claimed in claim 10 comprising:
  determining a plurality of different measurement values under said defined test conditions and respective time intervals, for said X-ray radiator;
  for each of said measurement values determining a forecasted progression of future measurement values based on the respective measurement value and previous respective measurement values determined at earlier times under said test conditions and stored in said memory, thereby providing a plurality of forecasted progressions; and
  determining said forecasted remaining life span based on said plurality of forecasted progressions and a further limit value, stored in said memory, for each of said forecasted progressions for said X-ray radiator.

12. A method as claimed in claim 10 comprising determining said limit value for said X-ray radiator prior to installation of said X-ray radiator in said X-ray apparatus.

13. A method as claimed in claim 12 wherein said previous measurement values include a measurement value obtained prior to installation of said X-ray radiator in said X-ray apparatus, and determining said forecasted progression by comparing said measurement value determined under said test conditions and at said respective time intervals with said measurement value obtained prior to installation.

14. A method as claimed in claim 10 comprising locating said memory at said X-ray radiator.

15. A method as claimed in claim 14 wherein said X-ray apparatus includes a data processor disposed at said X-ray apparatus, and comprising accessing said memory at said X-ray radiator by said data processor, and determining the forecasted remaining life span of the X-ray radiator in said data processor.

16. A method as claimed in claim 15 wherein said data processor is a first processor, and comprising establishing a communication link between said first data processor and a second data processor, located remote from said X-ray apparatus, via a communication network.

17. A method as claimed in claim 10 wherein said X-ray apparatus includes a first data processor, and comprising establishing a communication link between said first data processor and a second data processor, located remote from said X-ray apparatus, via a communications network, disposing said memory at said second data processor, transferring said measurement values from said first data processor to said memory via said communication network, and determining said forecasted remaining life span of said X-ray radiator in said second data processor.

18. A method as claimed in claim 10 comprising automatically planning a replacement of said X-ray radiator when said forecasted remaining life span of said X-ray radiator falls below a predetermined value.

* * * * *